United States Patent

Noritake et al.

(10) Patent No.: US 6,521,474 B2
(45) Date of Patent: Feb. 18, 2003

(54) MANUFACTURING METHOD FOR REFLECTION TYPE LIQUID CRYSTAL DISPLAY

(75) Inventors: Kazuto Noritake, Gifu (JP); Toshifumi Yamaji, Aichi (JP); Ryuji Nishikawa, Gifu (JP); Yasushi Miyajima, Gifu (JP); Masayuki Koga, Gifu-ken (JP); Mitsugu Kobayashi, Nagoya (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/975,860

(22) Filed: Oct. 12, 2001

(65) Prior Publication Data

US 2002/0076845 A1 Jun. 20, 2002

Related U.S. Application Data

(63) Continuation-in-part of application No. 09/615,608, filed on Jul. 14, 2000, now Pat. No. 6,410,358, and a continuation-in-part of application No. 09/447,378, filed on Nov. 23, 1999.

(30) Foreign Application Priority Data

Nov. 27, 1998 (JP) .......................................... 10-337840
Nov. 30, 1998 (JP) .......................................... 10-340500
Jul. 14, 1999 (JP) .......................................... 11-200600
Oct. 27, 1999 (JP) .......................................... 11-305804

(51) Int. Cl.⁷ ............................................. H01L 21/00
(52) U.S. Cl. ...................... 438/30; 438/22; 438/138; 438/149; 438/151; 438/606
(58) Field of Search .......................... 438/30, 22, 149, 438/151, 606, 138

(56) References Cited

U.S. PATENT DOCUMENTS 3,862,360 A    1/1975   Dill et al. ................... 348/792
4,431,272 A    2/1984   Yazawa et al. .............. 349/113
4,648,691 A    3/1987   Oguchi et al. .............. 349/162
5,793,457 A  * 8/1998   Tamai et al. ................. 349/110
5,796,455 A    8/1998   Mizobata et al. ........... 349/112
6,162,654 A  * 12/2000  Kawabe ........................ 438/30
6,300,152 B1 * 10/2001  Kim ............................. 438/30
6,326,129 B1 * 12/2001  Hirose et al. ................ 430/312

FOREIGN PATENT DOCUMENTS

| EP | 0 883 015 A | 12/1998 |
| EP | 0 886 169 A | 12/1998 |
| EP | 0 996 026 A | 4/2000 |
| JP | 57-49983 | 3/1982 |
| JP | 6-230399 | 8/1994 |
| JP | 6-294954 | 10/1994 |
| JP | 7-318974 | 12/1995 |

OTHER PUBLICATIONS

Patent Abstracts Of Japan, Hozumi Shigeo, Production Of Light Control Plate, Japanese Patent No. 030107901 Published Aug. 5, 1991.

* cited by examiner

*Primary Examiner*—Richard Elms
*Assistant Examiner*—Pho M. Luu
(74) *Attorney, Agent, or Firm*—Cantor Colburn LLP

(57) ABSTRACT

On an insulating substrate, there are formed a first gate electrode, a gate insulating film, a semiconductor film, and an interlayer insulating film. Above the interlayer insulating film, a TFT is formed having a second gate electrode connected to the first gate electrode. Then, a photosensitive resin is formed over the entire surface of the extant layers. Subsequently, first exposure is applied using a first mask, and second exposure is then applied using a second mask with a larger amount of light than used for the first exposure. The second mask has an opening at a position corresponding to a source. Thereafter, the photosensitive resin film is developed thereby forming a contact hole and a concave.

7 Claims, 7 Drawing Sheets

MANUFACTURING METHOD FOR REFLECTION TYPE LIQUID CRYSTAL DISPLAY

CROSS REFERENCE TO RELATED APPLICATIONS

This application is a continuation in part application of U.S. patent application Ser. No. 09/615,608, is now U.S. Pat. No. 6,410,358 filed on Jul. 14, 2000, and Ser. No. 09/447,378, filed on Nov. 23, 1999, both of which are incorporated herein in their entirety.

BACKGROUND OF THE INVENTION

1. Field of the Invention

The present invention relates to a liquid crystal display device.

2. Description of the Related Art

Various conventional liquid crystal displays (LCDs) have been known. A particular example is an LCD of active matrix type, which comprises a thin film transistor (TFT) for controlling connection between a data line and a pixel electrode (a display electrode) for every pixel to thereby control display for each pixel.

A vertical alignment type of LCD, in which control of liquid crystal alignment is important, is also known. Japanese Patent Application Laid-open No. Hei 7-311383, for example, discloses formation of concaves and convexes on the surface of each pixel where it contacts liquid crystal, to therewith control the alignment of the liquid crystal.

SUMMARY OF THE INVENTION

The present invention aims to enable efficient manufacturing of a liquid crystal device having an electrical conductive film with a concave formed thereon.

According to the present invention, a photosensitive resin is exposed twice using two different masks before developing such that convexes of two different depths are formed on the resin. This enables reduction of the number of steps required to form convexes of two different depths.

In particular, a convex (a through hole) having one depth is used to constitute a contact hole, that communicates a thin film transistor and an electrical conductive film (a display electrode) of a size corresponding to a pixel, and a convex having another depth is used as a convex formed on the picture electrode. Moreover, the sloping surface of the convex is utilized to control the alignment of liquid crystals.

BRIEF DESCRIPTION OF THE DRAWINGS

The above and other objects, features, and advantages of the present invention will become further apparent from the following description of an exemplary embodiment taken in conjunction with the accompanying drawings wherein.

DESCRIPTION OF THE PREFERRED EMBODIMENTS

In the following, a manufacturing method for a reflection type LCD according to the present invention will be described.

Figure 1A:
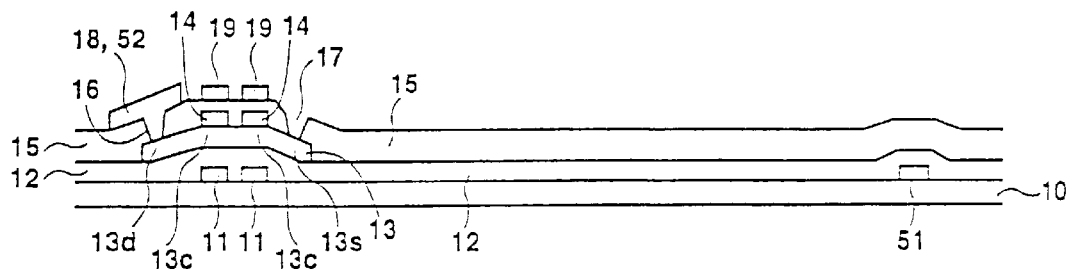
FIGS. 1(a), 1(b), 1(c), 1(d), 1(e) are cross sectional diagrams showing manufacturing steps in an exemplary embodiment
Figure 1B:
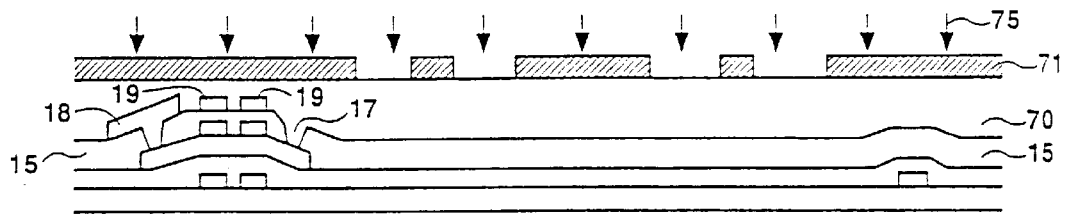
Figure 1C:
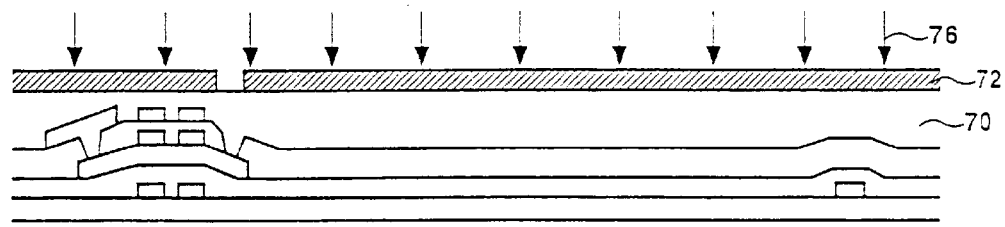
Figure 1D:
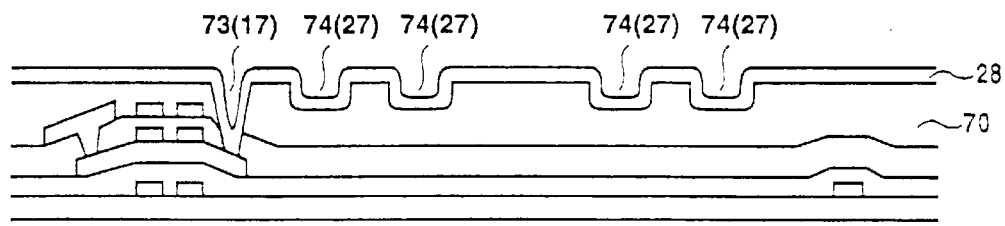
Figure 1E:
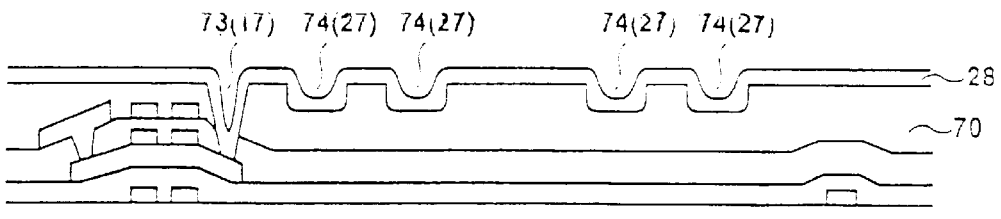
Figure 2:
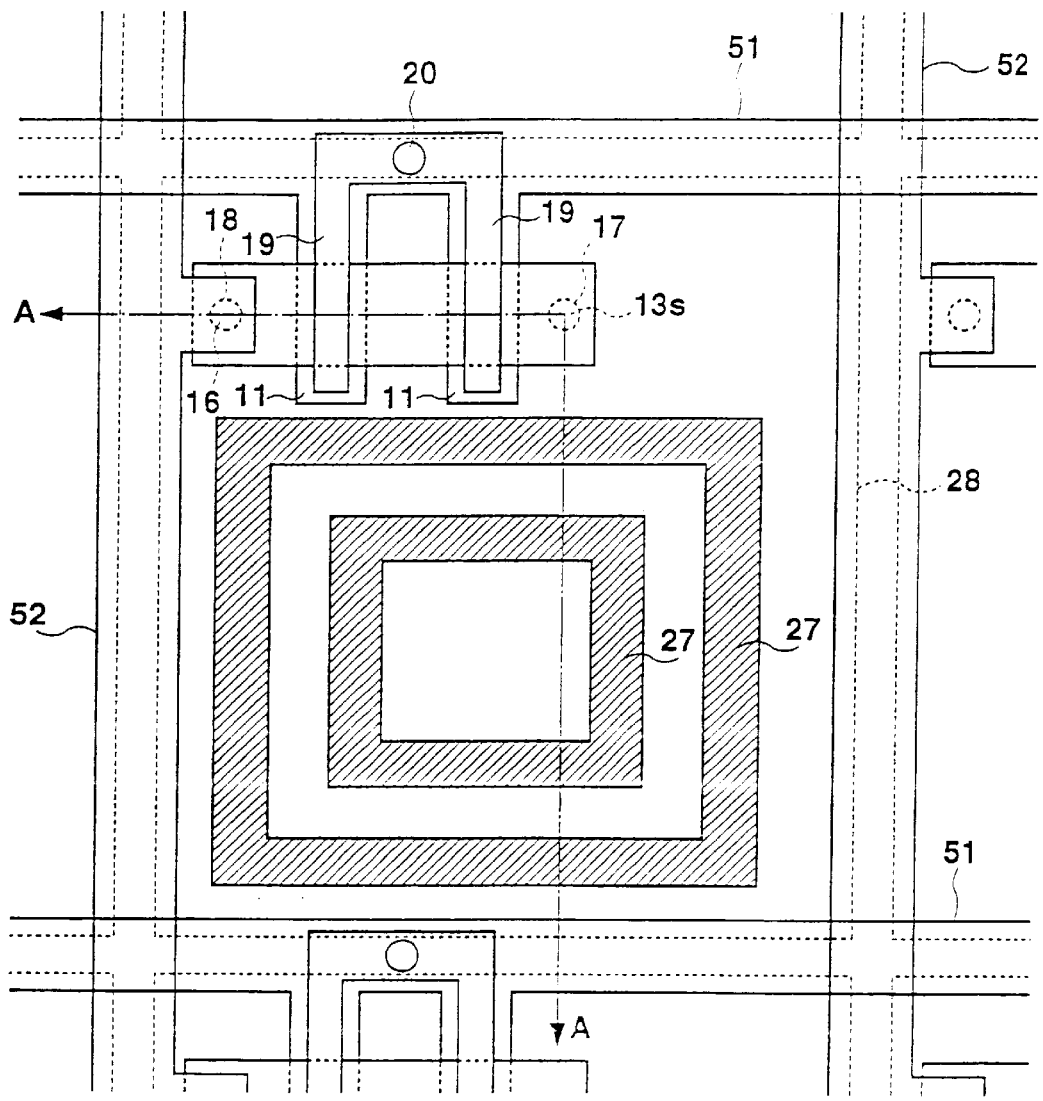
FIG. 2 is a plan view showing a liquid crystal device.

FIGS. 1(a) to 1(e) are cross sectional views, along the line A—A in FIG. 2, showing manufacturing steps for a LCD of the present invention.

As shown in FIG. 2, a TFT is formed in an area close to each intersection of a gate signal line 51 and a drain signal line 52. The gate signal line 51 includes a first gate electrode 11, while the drain signal line 52 includes a drain electrode 16. A display electrode 28, which comprises electrically conductive material, is connected to the TFT. The display electrode 28 is provided extending above the TFT, and has a surface with concaves 27 formed thereon.

Step 1 (FIG. 1(a)): on an insulating substrate 10, there are sequentially formed a first gate electrode 11, a gate insulating film 12, and an active layer 13, wherein the insulating substrate 10 comprises a quartz glass, a non-alkali glass, and so on, the first gate electrode 11 constitutes a part of the gate signal line 51 and comprises refractory metal (Cr, Mo, and so on), the gate insulating film 12 comprises a SiN film and a $SiO_2$ film, and the active layer 13 comprises a polycrystalline silicon film.

In the active layer 13, there are formed a channel 13c above the first gate electrode 11, and a source 13s and a drain 13d at the respective sides of the channel 13c. The source 13s and the drain 13d are formed through ion implantation.

On the channel 13c, there is formed a stopper insulating film 14, comprising a $SiO_2$ film, as a mask covering the channel 13c for preventing ion intrusion at the time of ion implantation.

Covering the entire surface of the gate insulating film 12, the active layer 13, and the stopper insulating film 14, there is formed an interlayer insulating film 15, which comprises laminated $SiO_2$ film, SiN film and $SiO_2$ film. The interlayer insulating film may be formed of either a single layer of organic material such as SiO, SiN, acrylic, and so on, or multiple layers of combinations of any thereof.

Then, contact holes 16, 17 are formed in the interlayer insulating film 15 at respective positions corresponding to the drain 13d and the source 13s. The contact hole 16, corresponding to the drain 13d, is filled by metal, specifically, by a single Al layer or sequentially laminated Mo and Al layers, thereby forming a drain electrode 18. At the same time as formation of the drain electrode 18, a second gate electrode 19 is formed on the interlayer insulating film 15 above the channel 13c. That is, a second gate electrode 19 is formed using metal such as a single Al layer or laminated Mo and Al layers.

The second gate electrode 19 is connected to the gate signal line 51 on the insulating substrate 10, via a contact hole 20, formed in the gate insulating film 12 and the interlayer insulating film 15.

A drain signal line 52 is formed on the interlayer insulating film 15 at the same time as formation of the drain electrode 18, which constitutes a part of the drain signal line 52.

Step 2 (FIG. 1(b)): a photosensitive resin film 70, made of insulating resin having photosensitivity and an even surface, is formed over the entire surface of the interlayer insulating film 15, including the contact hole 17, the drain signal line 52, the drain electrode 18, and the second gate electrode 19. Thereafter, a first mask 71 having an opening at a position corresponding to a concave 27 to be formed on an area where a display electrode 28 is to be formed, is placed before first exposure 75 is applied. The amount of exposure is determined such that the light reaches a point at a shallow depth below the surface of the photosensitive resin 70, specifically, 20 mJ/cm$^2$ to 60 mJ/cm$^2$ preferably 25 mJ/cm$^2$ to 50 mJ/cm$^2$, and more preferably 30 mJ/cm$^2$ to 40 mJ/cm$^2$.

Note that specific examples of photosensitive resin may be acrylic resin or polyimide.

Step 3 (FIG. 1(c)): the first mask 71 is removed, and a second mask 72 is placed instead. The second mask 72 has an opening at a position corresponding to a place where a contact hole 73 for connection between the source 13s of the active layer 13 and the display electrode 28 is to be formed.

After the deposition of the second mask 72, second exposure 76 is applied. The amount of the second exposure is larger than that for the first exposure so that a deeper contact hole 73 than the concave 74 can be formed. That is, in order for the exposure light to reach deeper, specifically, deep enough to form a contact hole 73 reaching the source 13s, the amount of second exposure 76 must be large enough, specifically, 200 mJ/cm$^2$ to 600 mJ/cm$^2$, preferably 250 mJ/cm$^2$ to 500 mJ/cm$^2$, more preferably, 300 mJ/cm$^2$ to 400 mJ/cm$^2$.

Step 4 (FIG. 1(d)): after the second mask 72 is removed, the photosensitive resin film 70 is developed whereby a concave 74 and a contact hole 73 are formed.

After the formation of the concave 74 and the contact hole 73 as described above, a display electrode 28, made of a transparent semiconductor material such as ITO, is formed thereon. With the above, the contact hole 17 (corresponding to 73 in FIG. 1) and the concave 27 (corresponding to 74 in FIG. 1) are completed.

In addition, an alignment layer for aligning liquid crystal is formed on the display electrode 28. Formation of the alignment film completes a TFT substrate. Then, opposing the TFT substrate, an opposing electrode substrate is formed, which has an opposing electrode and an alignment layer formed on the side thereof having liquid crystal, and a retardation film and a polarizer formed on the other side thereof without liquid crystal (i.e., on the observer side). The TFT substrate and the opposing electrode substrate are attached to each other along the edges thereof and liquid crystal is filled into the space between them, so that a reflection type LCD is completed.

It should be noted that the opposing electrode substrate is substantially transparent, and is not segmented for every pixel.

Figure 3:
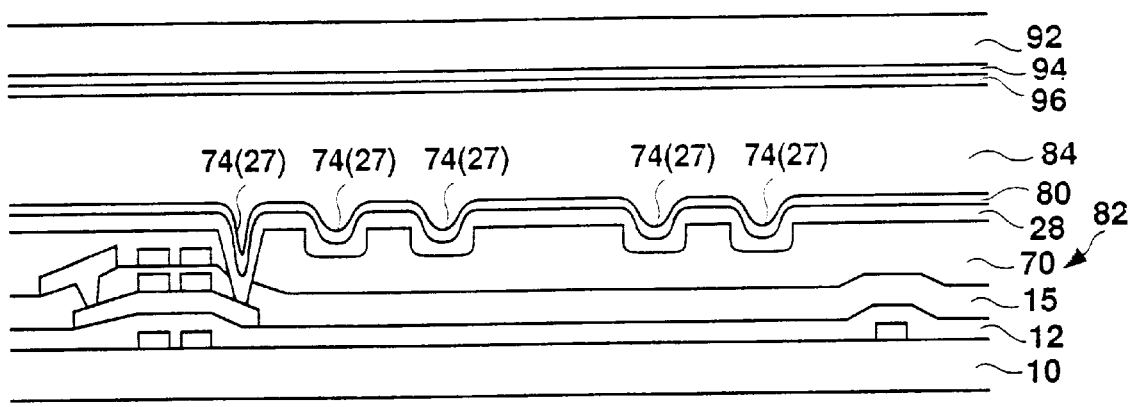
FIG. 3 is a cross sectional diagram showing a liquid crystal device.

Further, as shown in FIG. 3, an alignment film 80 is formed over the entire surface of the display electrode 28 for aligning the liquid crystal. With the above, a TFT substrate 82 completes. Moreover, an opposing electrode substrate 90 is provided opposing to the TFT substrate 82 via the liquid crystal 84.

The opposing electrode substrate 90 comprises a transparent substrate 92, similar to the substrate 10, having opposing electrodes 94 and an alignment film sequentially stacked on the surface thereof closer to the liquid crystal 84. Further, the TFT substrate 82 and the opposing electrode substrate 90 are attached to each other at the peripheries thereof, and liquid crystal 84 is enclosed in the space between the TFT substrate 82 and the opposing electrode substrate 90.

A polarization panel (not shown) is provided outside the substrate 10 and outside the substrate 92. For color display, a protective film and R, G, B color filters, having a light shielding black matrix, are provided between the substrate 92 and the opposing electrode 94 of the opposing electrode substrate 90.

As described above, the use of photosensitive resin and exposure with the photosensitive resin using different amounts of light for formation of a desired contact hole and a concave, readily enable formation of a contact hole and a concave without the need of two formations of a planarization insulating film, as is conventionally needed. Therefore, the manufacturing process can be simplified, and costs can be reduced.

It should be noted that the present invention is not limited to the above embodiment, in which a concave and a contact hole are formed by development. Moreover, heating at, e.g., about 220. after the development would make more gently slanting edges of the concave 74, as shown in FIG. 1(e).

Also, the present invention is not limited to the above embodiment, in which concaves 27 are formed as two analogous rectangles formed in a reflection display electrode formation area, and the concave 27 may rather be formed in a circle or in two or more different shapes instead. Moreover, the number of the concave 27 is not limited to two, as described above, and a single concave 27 or three or more concaves 27 may be formed instead.

Further, the area where the concave 27 is formed is not limited to an area enclosed by the gate signal line 51 and the drain signal line 52, and the concave 27 may rather be formed in an area overlapping the gate signal line 51 or the drain signal line 52.

Still further, the present invention is not limited to the above embodiment, in which the circumferential edges of adjacent display electrodes 28 overlap the gate signal line 51 and the drain signal line 52, and the edge may rather overlap either one of the gate signal line 51 and the drain signal line 52 or may even not overlap the signal line. Yet further, the display electrode 28 may not extend over the TFT.

Moreover, the insulating film between the second gate electrode 17 and the active layer 13, i.e., the stopper insulating film 14, the interlayer insulating film 15, and the planarization insulating film 19 in this embodiment, may each be constituted of a single SiO, SiN, or any organic film, or a laminated combination thereof.

Also, instead of the above described TFT having a double gate electrode structure, having two gates, a single gate structure, having one gate, or a multiple gate structure, having two or more gates, may be similarly applicable.

Figure 4A:
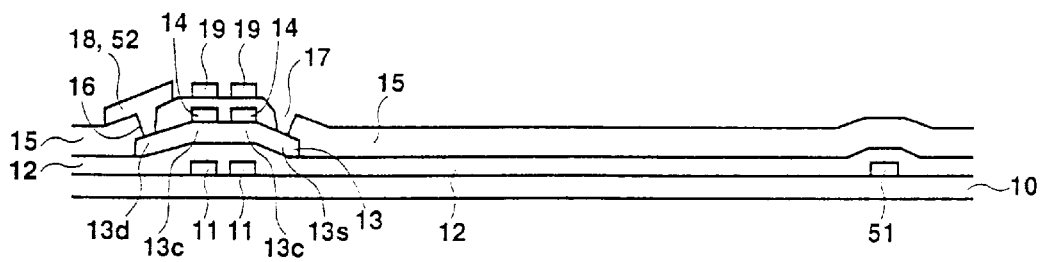
FIGS. 4(a), 4(b), 4(c), 4(d), 4(e) are cross sectional diagrams showing manufacturing steps in another exemplary embodiment.
Figure 4B:
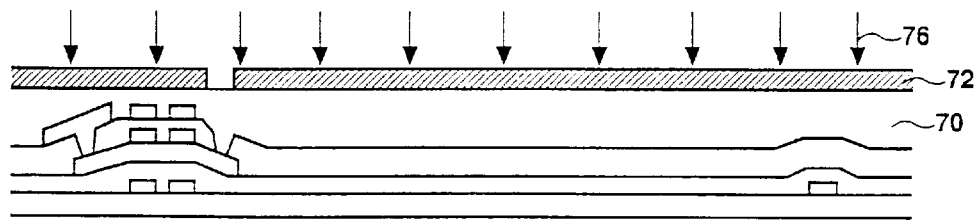
Figure 4C:
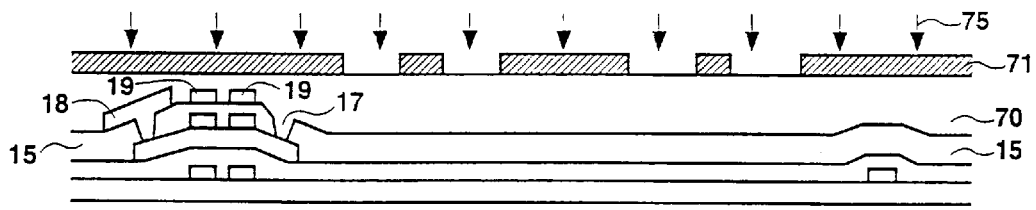
Figure 4D:
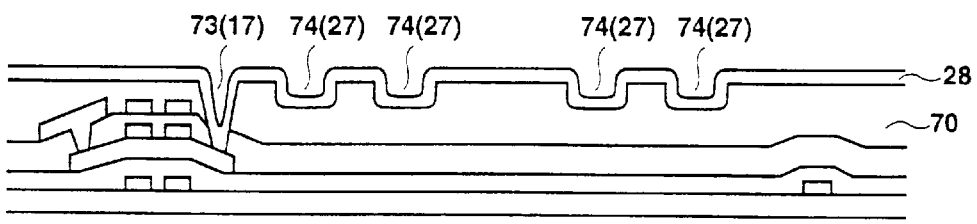
Figure 4E:
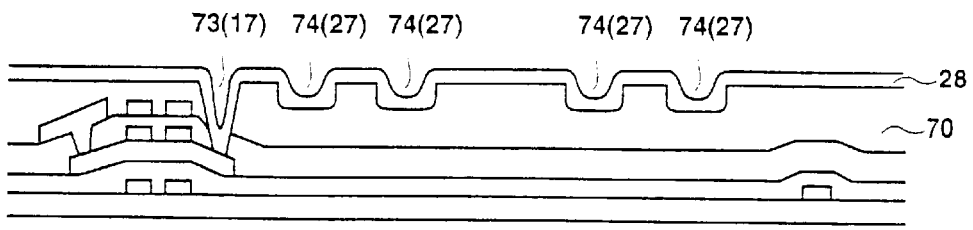

The order of formation of the contact hole 72 and the concave 74 may be reversed from that shown in FIGS. 1(a) to 1(e), into that shown in FIGS. 4(a) to 4(e). With the reversed order, exposure for formation of the contact hole 73, as shown in FIG. 4(b), is initially applied, followed by exposure for formation of the concave 74, as shown in FIG. 4(c). In this case, FIGS. 4(a), 4(d), 4(e) are identical to FIGS. 1(a), 1(d), 1(e), FIG. 4(b) is identical to FIG. 1(c), and FIG. 4(c) is identical to FIG. 1(b).

Here, the alignment films 80, 96 are made of an organic resin, such as polyimide, serving as a vertical alignment film for vertical alignment of crystal liquid 84 having negative dielectric anisotropic. The alignment films 80, 96 do not require rubbing. It should be noted that liquid crystal having positive dielectric anisotropic may be employed for the liquid crystal 84.

For the liquid crystal 84 comprising liquid crystal having negative dielectric anisotropic, liquid crystal molecules are aligned vertically with respect to the substrate when no voltage is applied, and aligned substantially parallel to the substrate when a voltage is applied.

In an exemplary embodiment, in which a concave 74 is formed, the concave 74 serves to control, via the sloping surface thereof, liquid crystal alignment. Specifically, for the liquid crystal 84 comprising liquid crystal having negative dielectric anisotropic, the liquid crystal molecules are aligned vertical to the surface of the alignment film 80 when no voltage is applied. Therefore, the liquid crystal molecules located in the upper portion of the sloping surface of the concave 74 now have an alignment direction inclined, so that the liquid crystal molecules within a pixel are divided. This serves to widen the viewing angle.

Figure 5:
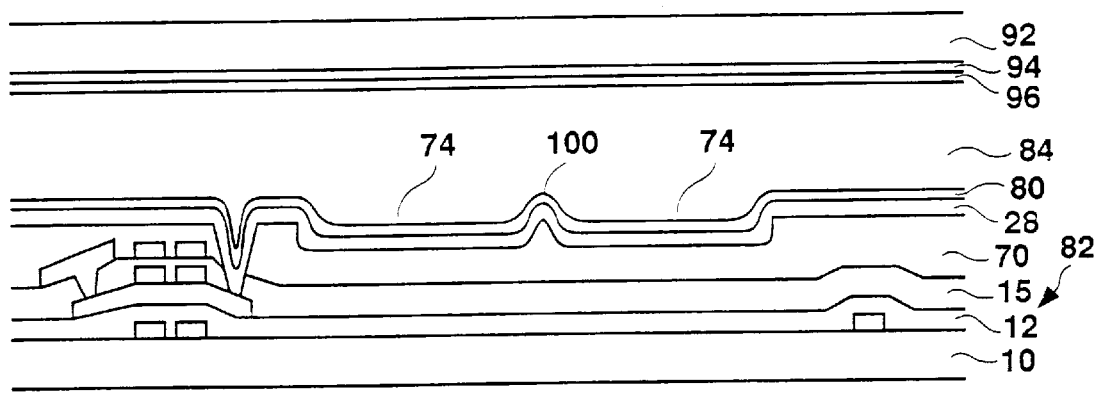
FIG. 5 is a cross sectional diagram showing a liquid crystal device of still another exemplary embodiment.

Further, preferably, a concave 74 may be formed in a large size, leaving the rest as a convex. That is, as shown in FIG. 5, the concave 74 may be formed extending over the substantially entire surface of the pixel with a part thereof forming a convex 100. This makes it possible to control the alignment of the liquid crystal 84 by utilizing the sloping surface of the convex 100.

A method for controlling the alignment direction of liquid crystal referred to as Multi-domain Vertical Alignment (MVA) is disclosed in Japanese Patent Application Laid-open No. Hei 7-311383, which is incorporated herein in its entirety.

Figure 6:
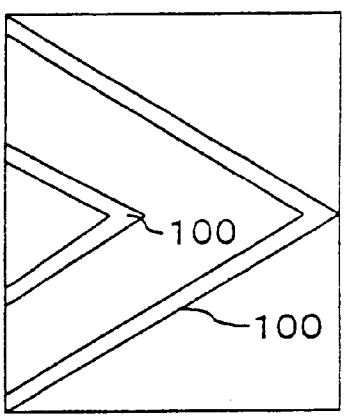
FIG. 6 is a diagram showing an exemplary structure of a convex portion.
Figure 6:
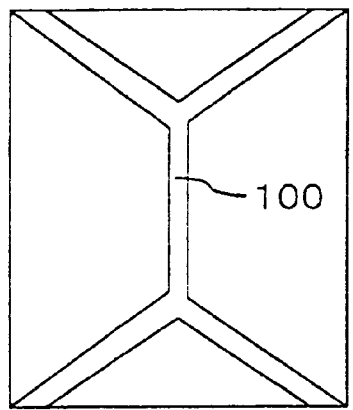
Figure 6:
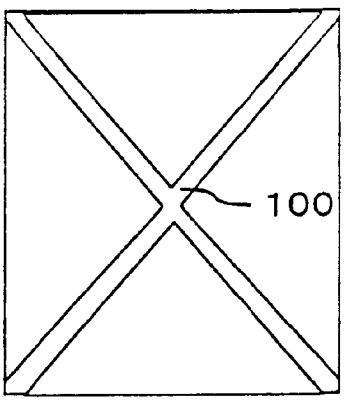
Figure 6:
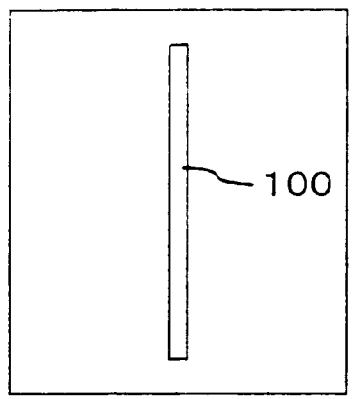
Figure 6:
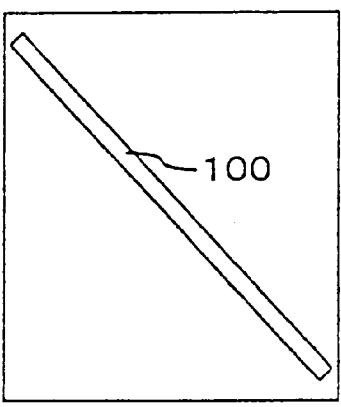
Figure 6:
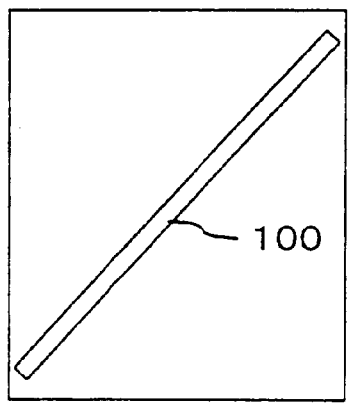
Figure 7:
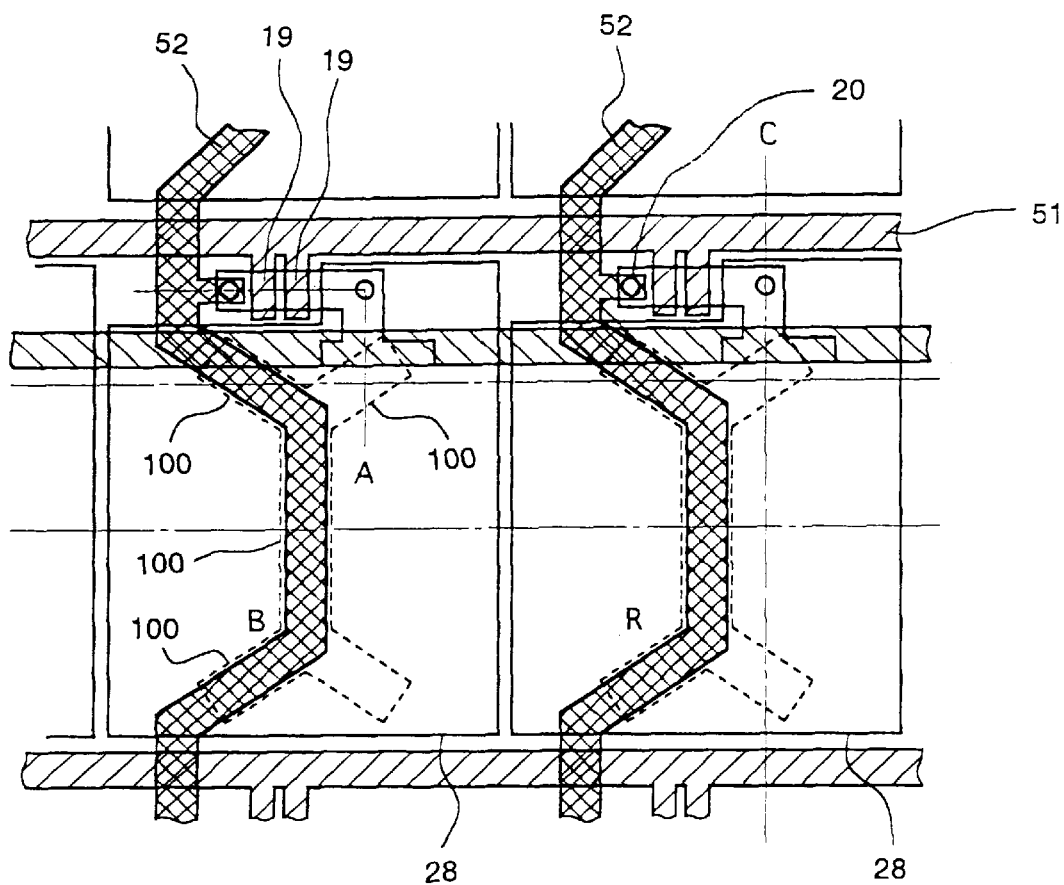
FIG. 7 is a cross sectional diagram showing a liquid crystal device in still another exemplary embodiment.

Preferably, the convex 100 has a shape as shown in FIG. 6. Specifically, two or more larger and smaller > shapes, two Y shapes connected up-and-down symmetrically, an X shape, an elongated shape, and a diagonal line shape are all preferable.

With such a convex 100 formed, the sloping surface of the convex 100 serves as an alignment control portion for controlling the alignment of the liquid crystal 84. Note that a concave 74 may be formed in any of the shapes shown in FIG. 6.

Formation of an alignment control portion on a pixel as described above results in a portion incapable of displaying an image thereabove. In this view, preferably, a data line is provided on the alignment control portion, in particular, a convex.

FIG. 4 is a plan diagram showing a liquid crystal display device in another exemplary embodiment.

As shown in FIG. 4, a plurality of gate signal lines 55 each having integrally formed gate electrode 11 are disposed horizontally, and a plurality of drain signal lines 52 are disposed vertically. A thin-film transistor (TFT), which is a switching element, is disposed in the vicinity of each intersection of the gate signal line 55 and the drain signal line 52, and a pixel electrode 19 made of a transparent conducting material such as ITO is connected to the TFT.

In FIG. 4, the convex 100 has a shape in which the bottom end of letter Y has the same forked shape as the top end, namely two letters Y are mutually connected with one of them turned upside down. In other words, the convex 100 has a shape that either end of its center region, which is rectangular and extending in a longitudinal direction of each pixel, is forked into two to extend toward two corners of the pixel.

A feature of this embodiment is that the drain signal line 52 is formed along the convex portion 100 disposed on the substrate. In FIG. 4, the drain signal line 52 in the vicinity of the TFT enters the pixel region from its upper left, bends to extend in the lower right-hand direction to follow a branch section 100 at the upper left part of the convex portion 100a, and at a section 100b of the convex portion 100 extending vertically in FIG. 4, extends vertically in the same way. The drain signal line 52 further bends to extend in the lower left direction to follow a branch section 100c extending in a lower left direction of the convex portion 100, leaves the pixel from its lower left, and extends to a pixel in the next row. Thus, the drain signal line 52 is disposed to overlap with the left-side branch sections and the vertical section of the convex portion 100.

The liquid crystal immediately above the convex portion 100 keeps a vertically aligned state because an electric field is not produced and the alignment is not controlled. Therefore, it becomes a light-shielding region that always does not allow the passage of light. In this embodiment, the drain signal line 52 which is a metal line and has a light-shielding function is disposed there, so that the two light-shielding regions are overlapped. As a result, the light-shielding region occupying the pixel region becomes small, and an aperture ratio is improved. The region immediately below the convex portion 100 is a boundary of the liquid crystal in its alignment direction in the pixel, so that the alignment direction tends to be disturbed. When the alignment direction is disturbed, light may leak erroneously. But, since the drain signal line 52 having the light-shielding function is disposed in this embodiment, the present invention can prevent the light from leaking and can further enhance contrast.

What is claimed is:

1. A manufacturing method for a liquid crystal display, said method comprising:
    forming a photosensitive resin film on a substrate;
    exposing the photosensitive resin film with a first amount of light via a first mask;
    exposing the photosensitive resin film with a second amount of light via a second mask, wherein the first amount of light and the second amount of light differ from each other;
    developing the photosensitive resin film subjected to two exposures thereby forming two types of concaves having different depths, wherein the concaves have depths in accordance with the amount of light;
    forming an electrical conductive film on the photosensitive resin film developed to have two types of concaves.

2. A manufacturing method according to claim 1, further comprising forming a thin film transistor on the substrate so that the photosensitive resin film is formed thereon, wherein
    the photosensitive resin film constitutes an insulating film,
    the electrically conductive film is a pixel electrode having a size corresponding to a pixel, and
    the pixel electrode is electrically connected to the thin film transistor.

3. A manufacturing method according to claim 2, wherein
    the first amount of light is larger than the second amount of light,
    the concave formed using the first mask is a hole piercing through the photosensitive resin film, constituting a contact hole for electrically connecting the pixel electrode and the thin film transistor, and
    the concave formed using the second mask constitutes a concave formed on a surface of the pixel electrode.

4. A manufacturing method according to claim 2, wherein
    the second amount of light is larger than the first amount of light,
    the concave formed using the first mask constitutes a concave formed on a surface of the pixel electrode, and the concave formed using the second mask is a hole piercing through the photosensitive resin film, constituting a contact hole for electrically connecting the pixel electrode and the thin film transistor.

5. A manufacturing method according to claim 1, further comprising heating the photo sensitive resin to give edges of the concave a gentler slope.

6. A manufacturing method for a liquid crystal display, said method comprising:

forming a photosensitive resin film on a substrate;

exposing the photosensitive resin film with a first amount of light via a first mask;

exposing the photosensitive resin film with a second amount of light via a second mask;

developing the photosensitive resin film by subjecting it to two exposures, thereby forming a hole piercing the photosensitive resin film and a concave not piercing the photosensitive resin film; and forming an electrical conductive film on the photosensitive resin film having two kinds of convexes and being developed, such that the hole piercing is used as a contact hole and a sloping surface of the concave is used as an alignment control portion.

7. A method according to claim 6, wherein the concave is formed substantially over the entire surface of the pixel, leaving the rest of the surface convex.

* * * * *